United States Patent [19]

Ishiyama

[11] Patent Number: 5,434,425

[45] Date of Patent: Jul. 18, 1995

[54] OPTICAL POSITION DETECTING APPARATUS

[75] Inventor: Toshiro Ishiyama, Tokyo, Japan

[73] Assignee: Nikon Corporation, Tokyo, Japan

[21] Appl. No.: 75,394

[22] Filed: Jun. 11, 1993

[30] Foreign Application Priority Data

Jun. 15, 1992 [JP]  Japan .................. 4-178913
Jun. 8, 1993 [JP]  Japan .................. 5-163247

[51] Int. Cl.[6] ............................................... G01N 21/86
[52] U.S. Cl. ........................................ 250/548; 356/400
[58] Field of Search .............. 250/548, 557; 356/400, 356/401

[56] References Cited

U.S. PATENT DOCUMENTS

| | | | |
|---|---|---|---|
| 4,558,949 | 12/1985 | Uehara et al. | 356/152 |
| 5,008,705 | 4/1991 | Sindledecker | 355/43 |
| 5,048,967 | 9/1991 | Suzuki et al. | 356/401 |
| 5,053,628 | 10/1991 | Yamamoto et al. | 250/557 |
| 5,124,562 | 6/1992 | Kawashima et al. | 250/548 |
| 5,268,744 | 12/1993 | Mori et al. | 356/400 |

Primary Examiner—David C. Nelms
Assistant Examiner—Steven L. Nichols
Attorney, Agent, or Firm—Keck, Mahin & Cate

[57] ABSTRACT

An optical position detecting apparatus detects a position level and inclination of a surface of an object to be detected without the need to increase the working distance of an objective optical system. The apparatus includes an objective optical system having a lens arranged to face the surface, an illuminating optical system for supplying a position detecting light beam from the periphery of the objective optical system, a photodetector for generating an electric output corresponding to a light beam received, a condenser optical system for converging a reflected light beam from the surface illumunated with the incident light beam from the illuminating optical system onto a photosensing surface of the photodetector, and a beam directing optical element for directing at least one of the incident light beam and the reflected light beam into an optical path passing through the lens.

6 Claims, 3 Drawing Sheets

OPTICAL POSITION DETECTING APPARATUS

BACKGROUND OF THE INVENTION

1. Field of the Invention

The present invention relates to an apparatus for optically detecting the surface position of an object. More particulary the invention relates to an apparatus so designed that in the focusing mechanism or the leveling mechanism of a projection exposure apparatus, the detection is made of the position level or the inclination of a surface of an object in an exposing area or the like defined by the projection exposure apparatus.

2. Description of the Prior Art

With projection exposure apparatus of the type heretofore used for the manufacture of VLSI's, particularly semiconductor devices having very fine structures, each of an automatic focusing and an automatic leveling constitutes one of important mechanisms for effecting the proper exposure. The surface of a wafer must be accurately arranged by these mechanisms at a focal position of a projection optical system or a position vertical to the optical axis of the projection optical system.

Detecting apparatus heretofore known for obtaining the position information of a wafer surface for such focusing mechanism and leveling mechanism have been disclosed for example in the specification of U.S. Pat. No. 4,558,949 assigned to the same assignee as the present application. This detecting apparatus utilizes an oblique illumination system in which a detecting light is introduced into a space between a projection optical system and the surface of a wafer. That is, the light is supplied from an oblique direction with respect to the optical axis of a projection objective lens so that the light is reflected by the wafer surface. The position information of the wafer surface is obtained from the reflected light. The position of the wafer surface is adjusted by the focusing mechanism and the leveling mechanism in accordance with the thus obtained information.

With the conventional position detecting apparatus of the above-mentioned oblique projection type, it has been necessary to ensure that the space between a projection optical system and the surface of a wafer or the working distance of the projection optical system is sufficient. This is not only extremely disadvantageous from the standpoint of the aberration compensation of the projection optical system but also causes a heavy burden from the lens manufacturing point of view.

For instance, in the projection optical system there is the need on the wafer side to prevent as far as possible the occurrence of aberrations through the arrangement for example of a lens which is nearly aplanatic from the aberration compensation point of view. Thus, in view of the recent demand for increasing the numerical aperture (N.A.) of the projection optical system and also increasing the field, the apertures of its lenses tend to be increased more and more. If the working distance of the projection optical system is increased under such conditions for the purpose of arranging a position detecting optical system of the oblique projection type, the lenses of the projection optical system tend to be increased in aperture still more. As a result, there is the disadvantage that increasing the lens apertures in the projection optical system which is nearly aplanatic not only causes more difficulties in the lens manufacture but also tends to make its optical performance dependent on a distortion due to its own weight.

SUMMARY OF THE INVENTION

It is the primary object of the present invention to provide an optical position detecting apparatus which overcomes the foreging deficiencies in the prior art and is capable of easily detecting the position level and inclination of a surface to be detected without increasing the working distance of a projection optical system.

In accordance with a basic aspect of the present invention, there is thus provided an optical position detecting apparatus comprising an objective optical system including a lens arranged to face the surface of an object to be detected, an illuminating optical system for supplying an incident light beam for detecting the position of said surface from the periphery of the objective optical system so as to produce a reflected light beam from said surface by the reflection of said incident light beam supplied from said illuminating optical system, light detecting means for generating an electric output corresponding to a received light beam, a condenser optical system for converging said reflected light beam onto a photosensing surface of said light detecting means, and beam directing means for directing at least one of said incident light beam supplied to said surface from said illuminating optical system and said reflected light beam directed toward said condenser optical system from said surface into an optical path passing through the lens arranged within the objective optical system to face said surface to be detected.

In accordance with another aspect of the present invention, the beam directing means includes at least one of first beam directing means for directing the incident light beam directed toward said surface from the illuminating optical means into a first optical path passing through the lens arranged within the objective optical system to face said surface and second beam directing means for directing the reflected light beam directed toward the condenser optical system from said surface into a second optical path passing through the lens arranged within the objective optical system to face said surface.

With the optical position detecting apparatus according to the present invention, owing to the construction in which a part of the optical path of the detecting incident light beam supplied to the surface to be detected is passed through the main objective lens to illuminate said surface or the reflected light beam from said surface is directed to the photosensing surface through the main objective lens in the position detecting optical system for said surface or the construction in which both the detecting incident light beam and the reflected light beam are passed through the main objective lens, there is no need to especially increase the space between the main objective lens and the surface to be detected.

Therefore, the working distance of the main objective lens need not be increased for the surface detecting system as in the case of the conventional apparatus of the so-called oblique projection type thus not only making it possible to reduce the aperture of the main objective lens to make it smaller in size but also making the main objective lens advantageous from the aberration compensation point of view, thereby making it possible to further improve the image forming performance of the main objective lens and decrease the size of the apparatus on the whole. In addition, the present invention has another advantage that the constructions of the conventional automatic focusing mechanism and leveling mechanism can be used as such to provide the required focusing mechanism and leveling mechanism for the detection of the position level and inclination of a surface to be detected.

The above and other objects, features and advantages of the present invention will become more apparent from the following description of its preferred embodiments shown only for illustrative purposes without any intention of limitation when taken in conjunction with the accompanying drawings.

DESCRIPTION OF THE PREFERRED EMBODIMENTS

Figure 1:
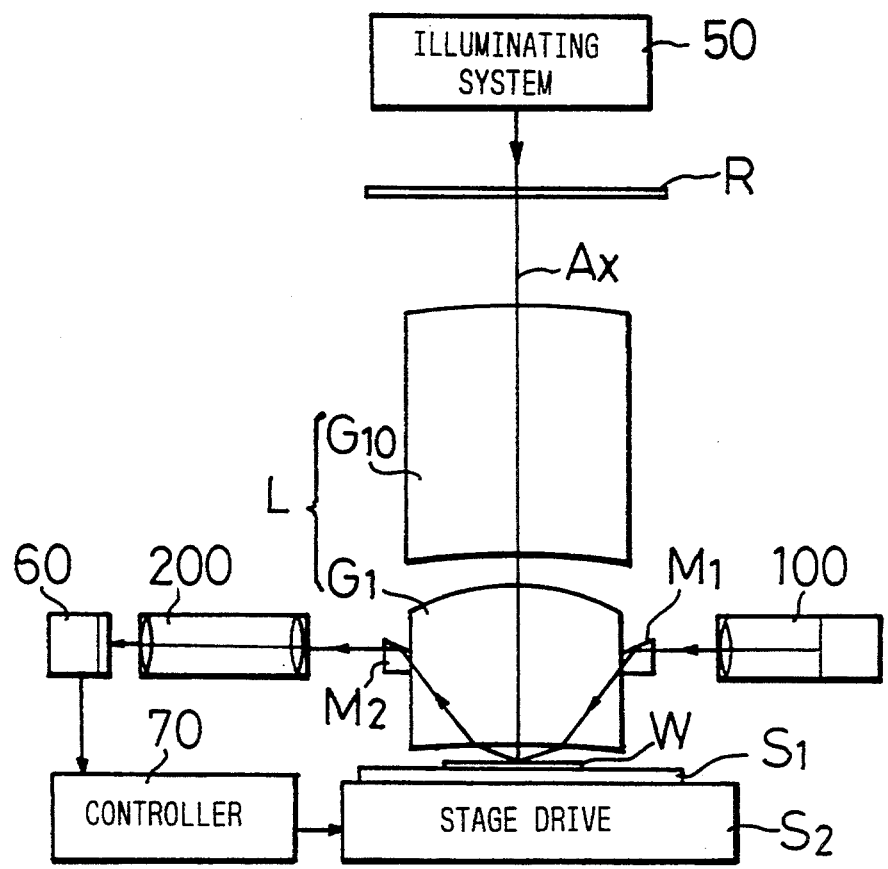
FIG. 1 shows schematically the construction of a first embodiment of the present invention.

Referring to FIG. 1, there is illustrated a first embodiment of the present invention which is applied to a projection optical system in which the nearest optical element to the wafer is composed of a lens. Here, it is to be noted that the position detecting light beam used for the purpose of automatic focusing and leveling does not necessarily pass through only the plane containing the optical axis of the projection optical system.

In FIGS. 1, a reticle R is uniformly illuminated by an illuminating system 50 so that the pattern on the reticle R is projected with a predetermined magnification onto a wafer W through a projection objective lens system L. The objective lens system L includes a lens group $G_{10}$ composed of a plurality of lenses and a lens $G_1$ on the nearest side to the wafer W.

The required light beam for automatic focusing and leveling purposes is supplied from an illuminating optical system 100 and the light beam is directed to a reflecting member $M_1$ held in close contact with the lens G, to serve as first beam directing means. The light beam introduced into the reflecting member $M_1$ is totally reflected internally by the inner surface of the reflecting member $M_1$ and its direction is changed to a first optical path passing through the lens $G_1$. After passing through the lens $G_1$, the light beam is projected as an incident light beam through the lens surface of the lens $G_1$ onto the surface of the wafer W.

The incident light beam supplied onto the wafer W is reflected by the surface of the wafer W so that the reflected light beam is directed so as to again pass through the lens $G_1$ and thus it is introduced into another reflecting member $M_2$ held in close contact with the lens $G_1$ to serve as second beam directing means. The reflected light beam introduced into the reflecting member $M_2$ is totally reflected internally by the inner surface of the reflecting member $M_2$ so that its direction is changed to a second optical path directed toward a condenser optical system 200 and the light beam is converged on the photosensing surface of a photodetector 60 by the condenser optical system 200.

The photodetector 60 generates the position information contained in the received light beam in the form of an electric signal and the output signal is applied to an operation controller 70. In accordance with the input position information, the operation controller 70 detects the position of the wafer W, that is, at least one of the detection of the focal position and the detection of the inclination of the wafer surface is performed.

The wafer W is held on a stage $S_1$ and the stage $S_1$ is carried on a stage drive $S_2$. The stage drive $S_2$ is controlled in accordance with the detection result of the operation controller 70 so that the position level of the wafer W in the direction of the optical axis $A_x$ of the projection objective lens system L or its inclination relative to the optical axis $A_x$ is changed and the desired automatic focusing and leveling adjustment are controlled in such a manner that eventually an image of the reticle R is projected onto the optimum position on the wafer W.

The construction of the apparatus disclosed in the specification of the previously mentioned U.S. Pat. No. 4,558,949 is well suited for such focal position detection and wafer surface inclination detection.

Figure 2:
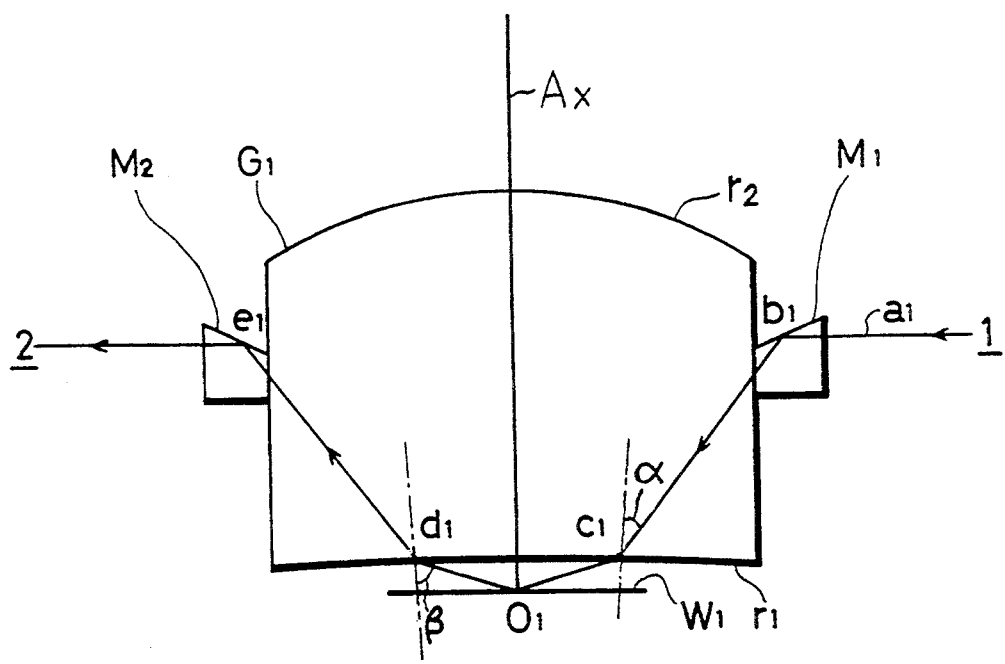
FIG. 2 shows in enlarged form the construction of a principal part of the first embodiment.

The principal part of the above-described first embodiment will now be described in greater detail with reference to the partial enlarged view of FIG. 2. In the Figure, the reflecting member $M_1$ serving as first beam directing means and another reflecting member $M_2$ serving as second beam directing means are closely attached to the peripheral surface of the lens $G_1$ which is mounted on the nearest side to the wafer within the projection optical system.

The light beam $a_1$ supplied from the illuminating projection optical system side 1 for the automatic focusing and leveling purposes is introduced into the reflecting member $M_1$ and the beam is totally reflected internally at a point $b_1$ on the inner surface of the reflecting member $M_1$. The internally reflected light beam is introduced into the lens $G_1$ on the nearest side to the wafer within the projection optical system.

In the reflecting member $M_1$, the light beam $a_1$ is incident on the surface which is perpendicular to the direction of travel of the light beam $a_1$ and the reflecting member $M_1$ is made of the same material as the lens $G_1$, that is, it is composed of a glass prism of the kind such that the light beam $a_1$ is totally reflected internally at the point $b_1$. Since the reflecting member $M_1$ is closely attached to the lens $G_1$, the reduction in transmittance during the passage of the light beam $a_1$ from the reflecting member $M_1$ to the lens $G_1$ does not practically give rise to any problem.

In addition, when passing from the lens $G_1$ through its lens surface $r_1$ which is on the side facing the wafer surface $W_1$, the light beam incident to the lens $G_1$ is refracted at a point $c_1$ on the lens surface $r_1$ and thus it is directed as an incident light beam from the lens $G_1$ towards a point $O_1$ in a detection area on the wafer surface $W_1$ (this is not necessarily the central point of an exposure area) with an orientation which is dependent on the refraction.

This incident light beam is reflected at the point $O_1$ on the wafer surface $W_1$ and the resulting reflected light beam is again introduced into the lens $G_1$ from a point $d_1$ on the lens surface $r_1$. The light beam entering into the lens $G_1$ is passed through the lens $G_1$ with an orientation determined by the refraction angle at the point $d_1$ and thereafter the light beam is totally reflected internally at a point $e_1$ on the inner surface of the reflecting member $M_2$. The light beam totally reflected internally is emitted from the reflecting member $M_2$ toward the condenser optical system side 2 and thus it is received by the photodetector (60 in FIG. 1) on the condenser optical system side 2.

In this case, the light beam is also emitted toward the condenser optical system side 2 through the surface of the reflecting member $M_2$ which is perpendicular to the direction of travel of the emitted light beam and the reflecting member $M_2$ is made of the same material as the lens $G_1$, that is, it is composed for example of a galss prism such that the light beam from the lens $G_1$ is subjected to internal total reflection. Since the reflecting member $M_2$ is also attached closely to the lens $G_1$, the reduction in transmittance during the passage of the light beam from the lens $G_1$ to the reflecting member $M_2$ is practically negligible.

In this way, the automatic focusing mechanism or the leveling mechanism is brought into operation in accordance with the control operation of the operation controller (at 70 in FIG. 1) based on the position information obtained by the photodetector thereby performing the desired adjusting operation for aligning the wafer surface $W_1$ with the predetermined focal position of the projection optical system or the predetermined posture position perpendicular to the optical axis Ax of the projection optical system.

It is to be noted that in this case it is important that when the light beam $a_1$ is passed through the lens $G_1$ and then emitted through the lens surface $r_1$ toward the wafer surface $W_1$, the light beam is not totally reflected internally by the lens surface $r_1$. For this reason, this optical system must be designed so as to satisfy the following expression;

$$\sin\alpha < 1/n_1$$

where, $\alpha$ represents the incident angle of the light beam $a_1$ on the inner surface of the lens surface $r_1$, i.e., the angle made by the normal at the point $c_1$ and the incident optical path connecting the points $b_1$ and $c_1$, and $n_1$ represents the refractive index of the lens $G_1$ mounted on the nearest side to the detection surface within the projection optical system.

Also, it is important to give attention such that the incident angle $\beta$ of the reflected light beam (the incident angle on the lens surface $r_1$ or the angle made by the normal at the point $d_1$ and the incident optical path connecting the points $O_1$ and $d_1$) is prevented from becoming excessively large in order that the photodetector may not fail to obtain a sufficient energy due to reduction in the transmittance.

Also, it is needless to say that where these incident light beam and the reflected light beam are passed through a second lens surface $r_2$ facing the first lens surface $r_1$ and also through the other lenses of the projection optical system, attention should be given to prevent the occurrence of total reflection and the reduction in transmittance of the surfaces through which these light beams are passed in the same manner as mentioned previously.

Figure 3:
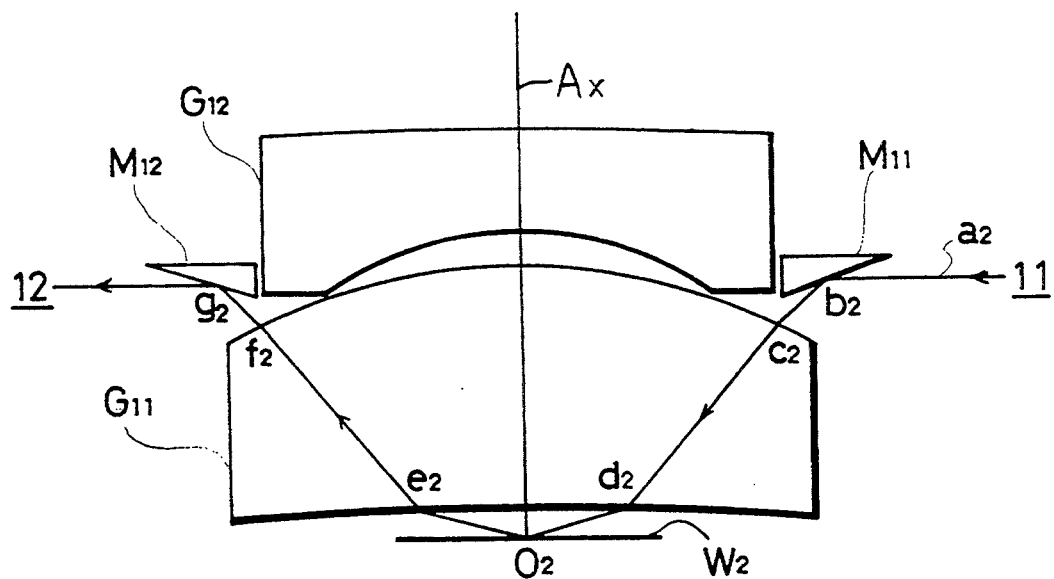
FIG. 3 shows in enlarged form the construction of a principal part of a second embodiment of the present invention.

Referring now to FIG. 3, there is illustrated schematically the construction of a principal part of a second embodiment of the present invention. In the second embodiment, a lens $G_{11}$ and a lens $G_{12}$ are arranged in this order from the side of a wafer surface $W_2$ in a projection optical system, and also arranged along the sides of the lens $G_{12}$ in spaced non-contacting relation with the lens $G_{11}$ are a reflecting member $M_{11}$ for introducing a light beam $a_2$ from an illuminating optical system side 11 into the lens $G_{11}$ on the nearest side to the wafer within the projection optical system and a reflecting member $M_{12}$ for directing to a condenser optical system side 12 the reflected light beam from the wafer surface $W_2$ of the incident light beam introduced into the lens $G_{11}$ by the reflecting member $M_{11}$.

In the second embodiment, the light beam $a_2$ incident on the lens $G_{11}$ from the illuminating optical system side 11 is reflected by the outer surface of the reflecting member $M_2$ and also the light beam directed from the lens $G_{11}$ toward the condenser optical system side 12 is reflected by the outer surface of the reflecting member $M_{12}$. Therefore, each of these light beams does not pass through the inside the reflecting member $M_{11}$ or $M_{12}$.

In FIG. 3, the light beam $a_2$ supplied from the illuminating optical system side 11 is reflected at a point $b_2$ on the outer surface of the reflecting member $M_{11}$ and then it is introduced into the lens $G_{11}$ through a point $c_2$ on the second lens surface of the lens $G_{11}$. The light beam introduced into the lens $G_{11}$ is refracted at a point $d_2$ on the first lens surface of the lens $G_{11}$ and thus the light beam is emitted from the lens $G_{11}$ to reach a point $O_2$ on the wafer surface $W_2$.

The light beam reaching the point $O_2$ on the wafer surface $W_2$ is reflected at the point $O_2$ so that the reflected light beam is again introduced into the lens $G_{11}$ at a point $e_2$ on the first lens surface of the lens $G_{11}$. The reflected light beam thus entered into the lens $G_{11}$ is passed through inside the lens $G_{11}$ and then directed through a point $f_2$ on its second lens surface to the reflecting member $M_{12}$ which is outside the lens $G_{11}$. This light beam is reflected by the outer surface of the reflecting member $M_{12}$, directed to the condenser optical system side 12 and then received by its photodetector (at 60 in FIG. 1).

In this way, the focusing mechanism or the leveling mechanism comes into operation in response to the control operation of the operation controller (at 70 in FIG. 1) according to the position information obtained by the photodetector. The desired adjusting operation is performed in such a manner that the wafer surface $W_2$ is aligned with the predetermined focal point of the projection optical system or the predetermined posture position perpendicular to the optical axis Ax of the projection optical system.

Figure 4:
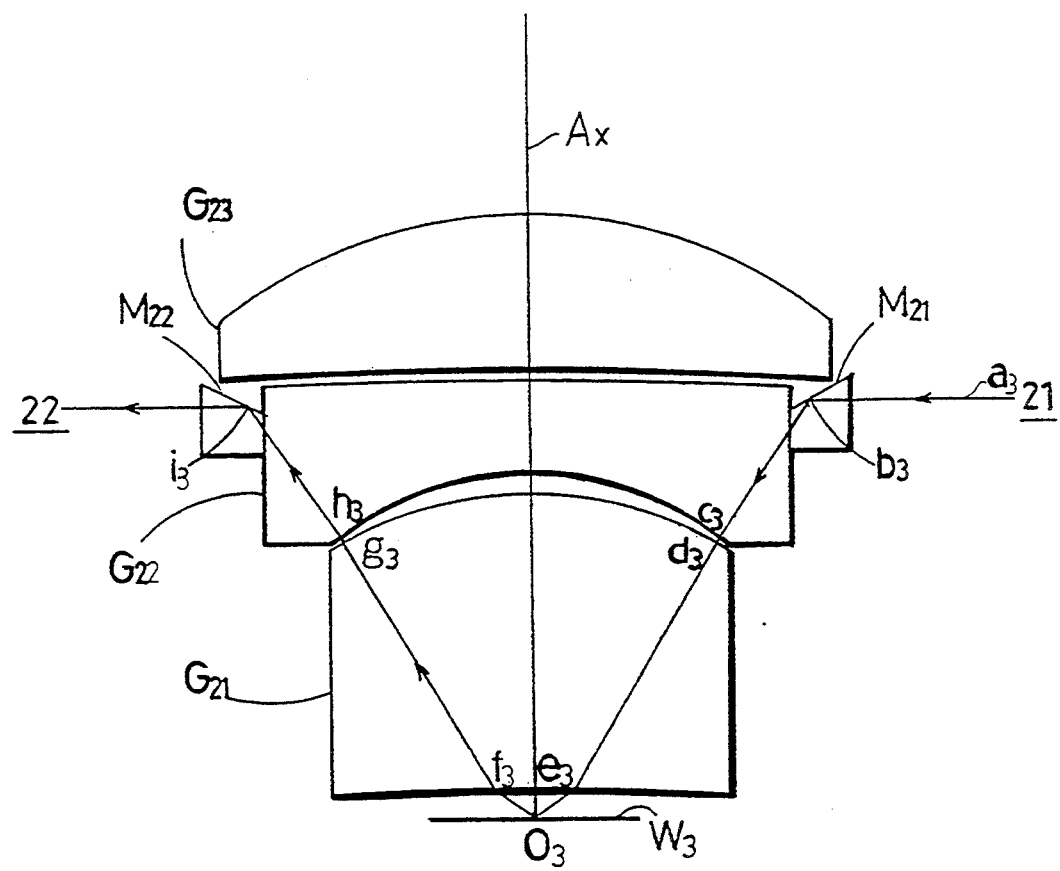
FIG. 4 shows in enlarged form the construction of a principal part of a third embodiment of the present inveniton.

Referring now to FIG. 4, there is illustrated schematically the construction of a principal part of a third embodiment of the present invention. In the third embodiment, lenses $G_{21}$, $G_{22}$ and $G_{23}$ are arranged in this order from the wafer surface $W_3$ side in a projection optical system, and also arranged to closely contact with the peripheral surface of the lens $G_{22}$ are a reflecting member $M_{21}$ for directing a light beam $a_3$ from an illuminating optical system side 21 to the lens $G_{21}$ on the most wafer side of the projection optical system and another reflecting member $M_{22}$ for directing to a condenser optical system side 22 the reflected light beam produced from the wafer surface $W_3$ when the light beam $a_3$ introduced into the lens $G_{21}$ by the reflecting member $M_{21}$ is supplied as an incident light beam to the wafer surface $W_3$ from the lens $G_{21}$.

In this third embodiment, when the incident light beam caused by the light beam $a_3$ and its reflected light beam from the wafer surface are respectively passed through the projection optical system, each of the two light beams is directed so as to be transmitted through the lens $G_{21}$ on the most wafer side and the lens $G_{22}$ adjacent to the former.

In FIG. 4, the light beam $a_3$ supplied from the illuminating optical system side 21 for the purpose of automatic focusing and leveling is introduced into the reflecting member $M_{21}$ which is closely attached to the peripheral surface of the lens $G_{22}$ so that the light beam $a_3$ is totally reflected internally at a point $b_3$ on its inner surface and then introduced into the lens $G_{22}$. In the reflecting member $M_{21}$, as in the case of the first embodiment, the light beam $a_3$ is incident on the surface which is perpendicular to the direction of travel of the light beam and also the reflecting member $M_{21}$ is made of the same material as the lens $G_{22}$, that is, it is composed for example of a glass prism which totally reflects the light beam $a_3$ at the point $b_3$.

The light beam $a_3$ introduced into the lens $G_{22}$ from the reflecting member $M_{21}$ is passed through the lens $G_{22}$, emitted from a point $c_3$ on its lens surface and then introduced into the most-wafer-side lens $G_{21}$ of the projection optical system at a point $d_3$ on the second lens surface of the lens $G_{21}$. The light beam introduced into the lens $G_{21}$ is passed through the lens $G_{21}$, refracted at a point $e_3$ on its first lens surface and converted to an incident light beam directed from the point $e_3$ to a point $O_3$ on the wafer surface $W_3$.

This incident light beam is reflected at the point $O_3$ on the wafer surface $W_3$ and thus this reflected light beam is again introduced into the lens $G_{21}$ from a point $f_3$ on the first lens surface of the lens $G_{21}$. The light beam introduced into the lens $G_{21}$ is passed through the lens $G_{21}$, emitted from a point $g_3$ on its second lens surface and then introduced into the lens $G_{22}$ at a point $h_3$ on the lens surface of the lens $G_{22}$.

The light beam introduced into the lens $G_{22}$ is passed through the lens $G_{22}$ to reach the reflecting member $M_{22}$ and thus the light beam is totally reflected internally at a point $i_3$ on the inner surface of the reflecting member $M_{22}$. This internally reflected light beam is emitted from the reflecting member $M_{22}$ so that it is directed to the condenser optical system side 22 and received by its photodetector (at 60 in FIG. 1).

In this case, the reflecting member $M_{22}$ also emits the light beam toward the condenser optical system side 22 through its surface which is perpendicular to the direction of travel of the emitted light beam, and the reflecting member $M_{22}$ is made of the same material as the lens $G_{22}$, that is, it is composed for example of a glass prism such that the light beam from the lens $G_{22}$ is totally reflected internally at the point $i_3$.

In this way, the focusing mechanism or the leveling mechanism comes into operation in response to the control operation of the operation controller (at 70 in FIG. 1) according to the position information obtained by the phodetector and the desired adjusting operation is effected in such a manner that the wafer surface $W_3$ is aligned with the predetermined focal position of the projection optical system or the predetermined posture position perpendicular to the optical axis Ax of the projection optical system.

Figure 5:
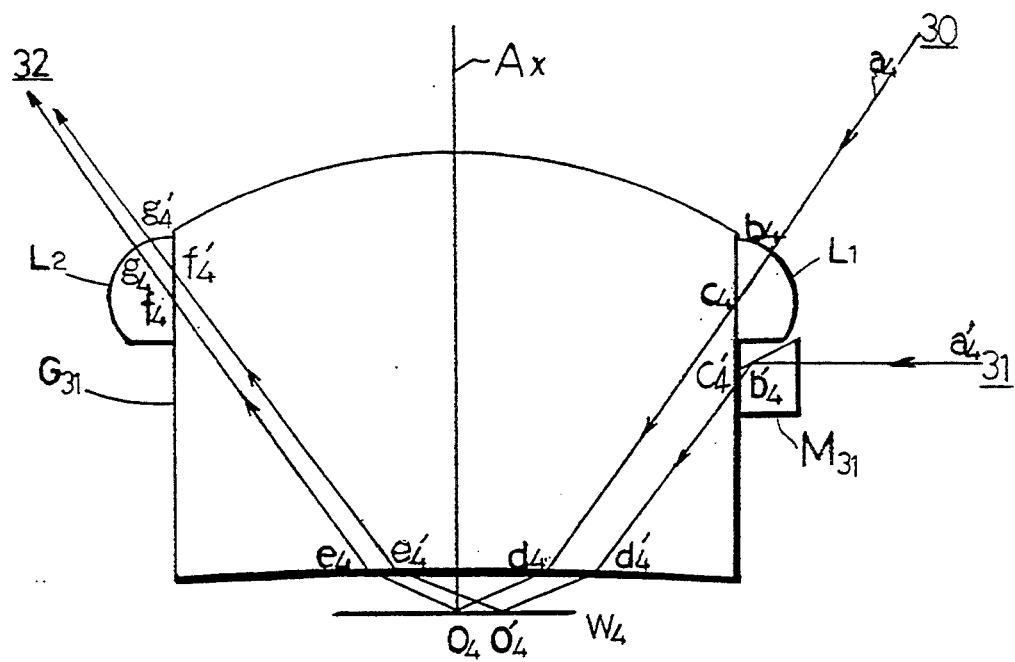
FIG. 5 shows in enlarged form the construction of a principal part of a fourth embodiment of the present invention.

Referring now to FIG. 5, there is illustrated schematically the construction of a principal part of a fourth embodiment of the present inveniton. In the fourth embodiment, a lens $G_{31}$ is arranged on the nearest side to a wafer within a projection optical system and arranged in close contact with the peripheral surface of the lens $G_{31}$ are a glass member $L_1$ for introducing a light beam $a_4$ from an illuminating optical system side 30 into the lens $G_{31}$ and a glass member $L_2$ for directing the reflected light beam of the incident light beam $a_4$ from the wafer surface $W_4$ to a condenser optical system side 32. In addition, a reflecting member $M_{31}$ for directing another light beam $a_4'$ from a illuminating optical system side 31 to the lens $G_{31}$ is arranged in close contact with the peripheral surface of the lens $G_{31}$. While, in this embodiment, the two light beams $a_4$ and $a_4'$ are used, the light sources of these light beams may be either the same or separate ones.

In FIG. 5, the light beam $a_4$ supplied from the illuminating optical system side 30 for automatic focusing and leveling; purposes is introduced into the glass member $L_1$ from a point $b_4$ on the surface of the glass member $L_1$ so that the light beam is transmitted through it and introduced through a point $c_4$ into the lens $G_{31}$. The glass member $L_1$ is made of the same material as the lens $G_{31}$ and it may either possess or not possess a refracting power at its surface on which the light beam $a_4$ falls.

The light beam $a_4$ transmitted through the lens $G_{31}$ is refracted and emitted at a point $d_4$ on the lens surface of the lens $G_{31}$ to arrive as an incident light beam at a point $O_4$ on the wafer surface $W_4$. The incident light beam is reflected at the point $O_4$ on the wafer surface $W_4$ and thus the reflected light beam is again introduced into the lens $G_{31}$ at a point $e_4$ on the lens surface of the lens $G_{31}$. The reflected light beam introduced into the lens $G_{31}$ is thereafter passed through a point $f_4$ on the close contacting surface between the lens $G_{31}$ and the glass member $L_2$ and introduced into the glass member $L_2$. This light beam is transmitted through the 91ass member $L_2$ so that the light beam is directed to the condensing optical system side 32 through a point $g_4$ on the surface of the glass member $L_2$ and it is finally received by the photodetector (60 in FIG. 1) of the condensing optical system.

On the other hand, the other light beam $a_4'$ supplied from the illuminating optical system side 31 for automatic focusing and leveling purposes is introduced into the reflecting member $M_{31}$ so that the light beam is totally reflected internally at a point $b_4'$ on its inner surface and then introduced into the lens $G_{31}$ through a point $c_4'$ on the close contacting surface between the reflecting member $M_{31}$ and the lens $G_{31}$. This light beam is further refracted and emitted at a point $d_4'$ on the lens surface of the lens $G_{31}$ and thus it is directed as an incident light beam to a point $O_4'$ on the wafer surface $W_4$.

This incident light beam is reflected at the point $O_4'$ on the wafer surface $W_4$ so that it is again introduced into the lens $G_{31}$ through a point $e_4'$ on the lens surface of the lens $G_{31}$, passed through the lens $G_{31}$ and directed to the 91ass member $L_2$ through a point $f_4'$ on the close contacting surface between the lens $G_{31}$ and the glass member $L_2$. Then, this light beam is transmitted through the 91ass member $L_2$ so that it is directed to the condenser optical system side 32 through a point $g_4'$ on the surface of the glass member $L_2$ and received by the photodetector (60 in FIG. 1) in the condensing optical system.

The position information of the points $O_4$ and $O_4'$ are obtained by the photodetector from the reflected light beams of the light beams $a_4$ and $a_4'$ from the wafer surface $W_4$ so that in accordance with this information the operation controller (at 70 in FIG. 1) brings the focusing mechanism and the leveling mechanism into operation and the desired adjustments are performed in such a manner that the wafer surface $W_4$ is brought to the predetermined focal position of the projection optical system and the predetermined position perpendicular to the optical axis of the projection optical system.

It is to be noted that as in the case of the first embodiment, it is desirable for each of the above-described embodiments that when setting the optical paths of the incident and reflected light beams in the most-wafer-side lens of the projection optical system, the optical path angles of the reflecting members or the glass members as well as other additional optical elements or the like are adjusted properly in such a manner that when the incident light beam or beams directed to the wafer surface from the lens surface of the lens and the resulting reflected light beam or beams directed to the lens surface from the wafer surface are passed through the lens surface, the occurrence of total reflection of the light beams and the occurrence of considerable reduction in the transmittance are prevented.

Further, while, in the above-mentioned embodiments, the photodetector can be composed of any of those heretofore used as the photodetectors of the focusing mechanism and the leveling mechanism such as a photoelectric conversion device whose photosensitive surface is divided into four parts, the present invention is not limited thereto and various photodetectors can be used widely irrespective of their types provided that the desired position information of a surface to be detected call be obtained in accordance with the reflected light beam from the surface to be detected.

Still further, while the above-described embodiments show the cases where a single or two light beams are used for detecting purposes in a position detecting optical system for a surface to be detected, in accordance with the present invention more than two detecting light beams may be used. Still further, it is needless to say that while, in accordance with the present invention, the detecting light beam or beams are directed to pass through a projection optical system, the present invention is also not limited in this respect to the cases where the detecting light beam or beams are transmitted through the single lens positioned on the nearest side to the wafer in the projection optical system or through the two lenses including the former lens and the adjacent lens, and it is possible to construct an apparatus such that such detecting light beams are directed to transmit through a greater number of lenses.

Still further, while, in these embodiments, the apparatus is constructed so that the main objective lens is arranged in opposition to the surface to be detected and a part of the optical path of each position detecting light beam is passed through the main objective lens and directed to the surface to be detected thereby causing the reflected light beam from the surface to be again passed through the main objective lens and directed to the photosensing portion of the photodetector through the condenser optical system, the present invention is not limited thereto and it is possible for example to construct the apparatus so that either one of the incident light beam on the surface to be detected and the reflected light beam from the surface to be detected is passed through the main objective lens. From the design point of view of the optical system, however, it is more preferable that both the incident light beam or beams and the reflected light beam or beams are directed to pass through the main objective lens.

Still further, while, in these embodiments, the objective lens L is composed of only a refracting system, the present invention is not limited thereto and the present invention is effective in cases employing an objective optical system of the catadioptric type having a reflecting surface.

What is claimed is:

1. An apparatus for optically detecting a surface position of an object to be detected comprising:
   an objective optical system including a lens arranged to face a surface of said object to be detected;
   an illuminating optical system for supplying a position detecting incident light beam and producing a reflected light beam;
   light detecting means for generating an electric output corresponding to a received light beam;
   a condenser optical system for condensing said reflected light beam so that it converges onto a photosensing surface of said light detecting means; and
   a reflecting member for reflecting the incident light beam so that it passes through said lens at a first acute incident angle relative to a surface of said lens facing said surface of said object and is reflected as said reflected light beam by said object at a second acute incident angle relative to said surface of said lens facing said surface of said object so that said reflected light beam passes back through said lens and to said condensor optical system, said first acute incident angle satisfying the expression $\sin\alpha < 1/n_1$, wherein $\alpha$ is said first acute incident angle and $n_1$ is a refractive index of said lens.

2. An apparatus according to claim 1, wherein said reflecting member is a first reflecting member for directing the incident light beam to said surface of said object from said illuminating optical system along a first optical path passing through said lens, and further comprising a second reflecting member for directing the reflected light beam to said condenser optical system along a second optical path passing through said lens.

3. An apparatus according to claim 2, wherein at least one of said first reflecting member and said second reflecting member is a prism member.

4. An apparatus according to claim 1, further comprising operation means for subjecting said electric output from said light detecting means to operational processing.

5. An apparatus according to claim 4, wherein said operation means detects a focal position of said surface of said object.

6. An apparatus according to claim 4, wherein said operation means detects an inclination of said surface of said object.

* * * * *